(12) United States Patent
Tsujii

(10) Patent No.: US 6,393,593 B1
(45) Date of Patent: May 21, 2002

(54) TESTER AND METHOD FOR TESTING LSI DESIGNED FOR SCAN METHOD

(75) Inventor: Toshiyuki Tsujii, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/368,579

(22) Filed: Aug. 5, 1999

(30) Foreign Application Priority Data

Apr. 12, 1999 (JP) ............................... 11-104216

(51) Int. Cl.⁷ ..................... G01R 31/28; G06F 11/00
(52) U.S. Cl. ................... 714/738; 714/724; 714/726; 714/733; 324/158.1; 324/755; 324/763
(58) Field of Search ................ 724/738, 724, 724/733, 728, 726; 324/755, 158.1, 763

(56) References Cited

U.S. PATENT DOCUMENTS

| | | | | |
|---|---|---|---|---|
| 5,410,247 A | * | 4/1995 | Ishizuka | 324/158.1 |
| 5,734,660 A | * | 3/1998 | Fujisaki | 714/726 |
| 6,138,257 A | * | 10/2000 | Wada et al. | 714/724 |
| 6,275,055 B1 | * | 8/2001 | Hyozo et al. | 324/755 |

FOREIGN PATENT DOCUMENTS

| JP | 2-38874 | 2/1990 |
|---|---|---|
| JP | 9-145788 | 6/1997 |

* cited by examiner

Primary Examiner—Emmanuel L. Moise
(74) Attorney, Agent, or Firm—Burns, Doane, Swecker & Mathis, LLP

(57) ABSTRACT

In a dc test, a plurality of dc test devices are connected to a plurality of tester pins, respectively and, in a function test, a function test device is connected to the plurality of tester pins.

6 Claims, 6 Drawing Sheets

TESTER AND METHOD FOR TESTING LSI DESIGNED FOR SCAN METHOD

BACKGROUND OF THE INVENTION

1. Field of the Invention

The present invention generally relates to LSI testers and, more particularly, to a LSI tester for executing a DC test and a function test of a semiconductor integrated circuit.

2. Description of the Related Art

FIG. 6 shows a construction of a LSI tester according to the related art. Referring to FIG. 6, the LSI tester comprises tester pins 90-1 through 90-n connected to respective input/output pins of a semiconductor integrated circuit, a DC test device 4 for testing the semiconductor integrated circuit to determine its dc characteristic by applying a preset voltage to the tester pins 90-1 through 90-n, and function test devices 80-1 through 80-n for determining the function of the semiconductor integrated circuit by applying a voltage corresponding to a test pattern for a function test and receiving, via the tester pins 90-1 through 90-n, corresponding logic values returned from the semiconductor integrated circuit as a result of the application of the voltage.

The function test devices 80-1 through 80-n respectively comprise function test execution units 8-1 through 8-n for generating the test pattern for a function test and determining the function of the semiconductor integrated circuit. There are further provided input/output units 9-1 through 9-n for applying the voltage generated by the function test execution units 8-1 through 8-n to the tester pins 90-1 through 90-n, respectively, and supplying, to the function test execution units 8-1 through 8-n, respectively, the logic values returned from the semiconductor integrated circuit as a result of the application of the voltage and received via the tester pins 90-1 through 90-n, respectively.

The LSI tester also includes switches 100-1 through 100-n for connecting the dc test device 4 to the tester pins 90-1 through 90-n, respectively, in a dc test, switches 200-1 through 200-n for connecting the function test devices 80-1 through 80-n to the tester pins 90-1 through 90-n, respectively, in a function test, and a controller 16 for controlling the dc test device 4, the function test devices 80-1 through 80-n, the switches 100-1 through 100-n and the switches 200-1 through 200-n.

A description will now be given of the operation of the LSI tester according to the related art.

Recently, many semiconductor integrated circuits have a built-in scan circuit or a boundary scan circuit to facilitate a function test.

A semiconductor integrated circuit may have a large number of input/output pins. However, if the circuit is designed for the scan method, a test can be performed by applying a test pattern voltage to small number of (normally, no more than 10) input/output pins.

In a dc test, the controller 16 turns the switches 100-1 through 100-n on and the switches 200-1 through 200-n off so as to connect the dc test device 4 to the tester pins 90-1 through 90-n.

Under the control of the controller 16, the dc test device 4 tests the semiconductor integrated circuit to determine its dc characteristic by applying the preset voltage to the tester pins 90-1 through 90-n.

A voltage greater than 3V (for example, 3.3V) may be applied to the test pins 90-1 through 90-n. A measurement is made to determine if a current is output from the input/output pins of the semiconductor integrated circuit. If a current is not output, it is determined that the circuit is normal.

In a function test, the controller 16 turns the switches 100-1 through 100-n off and the switches 200-1 through 200-n on so as to connect the function test devices 80-1 through 80-n to the tester pins 90-1 through 90-n, respectively.

Under the control of the controller 16, each of the function test execution units 8-1 through 8-n of the respective function test devices 80-1 through 80-n generates a test pattern for a function test. The input/output units 9-1 through 9-n of the respective function test devices 80-1 through 80-n apply the voltage corresponding to the test pattern to the respective test pins 90-1 through 90-n, respectively.

When the voltage corresponding to the test pattern is applied to the test pins 90-1 through 90-n and consequently to the corresponding input/output pins of the semiconductor integrated circuit, the semiconductor integrated circuit performs corresponding logic operations responsive to the input of the test patterns. The results of the logic operations are output to the input/output pins of the circuit. The input/output units 9-1 through 9-n of the respective function test devices 80-1 through 80-n receive the results via the tester pins 90-1 through 90-n, respectively, and supply the received results to the function test execution units 8-1 through 8-n, respectively.

Upon receipt of the results from the semiconductor integrated circuit, each of the function test execution units 8-1 through 8-n of the respective function test devices 80-1 through 80-n compares the result with an expectation value corresponding to the test pattern to determine whether the semiconductor integrated circuit is operating properly.

Notwithstanding its capability of executing both a dc test and a function test of a semiconductor integrated circuit, the related-art LSI tester constructed as described above has a drawback in that the production cost is high because it is not only necessary to provide tester pins but also an equal number of function test devices that are relatively expensive. The price of a LSI tester is generally determined by the number of function test devices.

SUMMARY OF THE INVENTION

Accordingly, a general object of the present invention is to provide a LSI tester in which the aforementioned drawback is eliminated.

Another and more specific object of the present invention is to provide a LSI tester in which a function test device is shared so that the production cost is reduced.

The aforementioned objects can be achieved by a LSI tester comprising: a plurality of tester pins each connected to an input/output pin of a semiconductor integrated circuit; a plurality of dc test devices each applying one of a predetermined voltage and a predetermined current to a corresponding one of the plurality of tester pins so as to determine a dc characteristic of the semiconductor integrated circuit; a function test device for determining a function of the semiconductor integrated circuit by applying a voltage corresponding to a function test pattern to selected ones of the plurality of tester pins and receiving, via the selected ones of the plurality of tester pins, corresponding logic values returned from the semiconductor integrated circuit as a result of the application of the voltage; and connecting means for connecting, in the dc test, the plurality of dc test devices to the plurality of tester pins, respectively, and connecting, in the function test, the function test device to the selected ones of the plurality of tester pins.

The aforementioned objects can also be achieved by a LSI tester comprising: a plurality of tester pins each connected to an input/output pin of a semiconductor integrated circuit; a plurality of dc test devices each applying one of a predetermined voltage and a predetermined current to a corresponding one of the plurality of tester pins so as to determine a dc characteristic of the semiconductor integrated circuit; function test execution means for generating a voltage corresponding to a function test pattern and determining a function of the semiconductor integrated circuit; a plurality of input/output means each applying a voltage corresponding to the test pattern generated by the function test execution means to a corresponding one of the plurality of tester pins, and supplying, to the function test executing means, a corresponding logic value returned from the semiconductor integrated circuit as a result of the application of the voltage and received via the corresponding one of the plurality of tester pins; and connecting means for connecting, in the dc test, the plurality of dc test devices to the plurality of tester pins, respectively, and connecting, in the function test, selected ones of the plurality of input/output means to corresponding ones of the plurality of tester pins.

A delay circuit may be provided between each of the plurality of input/output means and the function test execution means.

Each of the plurality of dc test devices may be provided with a memory for storing voltages corresponding to test pattern addresses, and determines, in response to a receipt of a test pattern address, one of the predetermined voltage and the predetermined current applied to the corresponding one of the plurality of tester pins by referring to the memory.

The connecting means may connect, in the function test, those of the plurality of tester pins connected to the input/output pins not involved in the function test, to corresponding ones of the plurality of dc test devices.

The aforementioned objects can also be achieved by a method of testing a LSI comprising the steps of: applying one of a predetermined voltage and a predetermined current to a plurality of tester pins connected to input/output pins of a semiconductor integrated circuit, in a dc test for determining a dc characteristic of the semiconductor integrated circuit; and applying a voltage corresponding to a function test pattern to selected ones of the plurality of tester pins, and receiving, via the selected ones of the plurality of tester pins, logic results returned from the semiconductor integrated circuit as a result of the application of the voltage, in a function test for determining the function of the semiconductor integrated circuit; wherein the method further comprises: connecting, in the dc test, a plurality of dc test devices for determining the dc characteristic to the plurality of tester pins, respectively; and connecting, in the function test, a function test device for determining the function to selected ones of the plurality of tester pins.

The aforementioned objects can also be achieved by a method of testing a LSI comprising the steps of: applying one of a predetermined voltage and a predetermined current to a plurality of tester pins connected to input/output pins of a semiconductor integrated circuit, in a dc test for determining a dc characteristic of the semiconductor integrated circuit; and generating a test pattern in a function test for determining the function of the semiconductor integrated circuit; wherein the method further comprises: connecting, in the dc test, a plurality of dc test devices for determining the dc characteristic to the plurality of tester pins, respectively; and connecting, in the function test, selected ones of a plurality of input/output means to selected ones of the plurality of tester pins, respectively, each of the plurality of input/output means applying a voltage corresponding to the test pattern to the selected ones of the plurality of tester pins, and supplying, to a function test execution unit for determining the function, a logic value returned from the semiconductor integrated circuit as a result of the application of the voltage and received via the selected ones of the plurality of tester pins.

According to the invention, a function test can be performed by providing only one function test device, which is relatively expensive. Consequently, the production cost of a LSI tester is reduced and the cost for testing a semiconductor integrated circuit is reduced.

In further accordance with the invention, any desired set of tester pins may be used such that individual tests via respective tester pins occur simultaneously.

In still further accordance with the invention, the voltage of an input/output pin of a semiconductor integrated circuit can be modified by applying an arbitrary test pattern while a function test is being performed.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Embodiment 1

Figure 1:
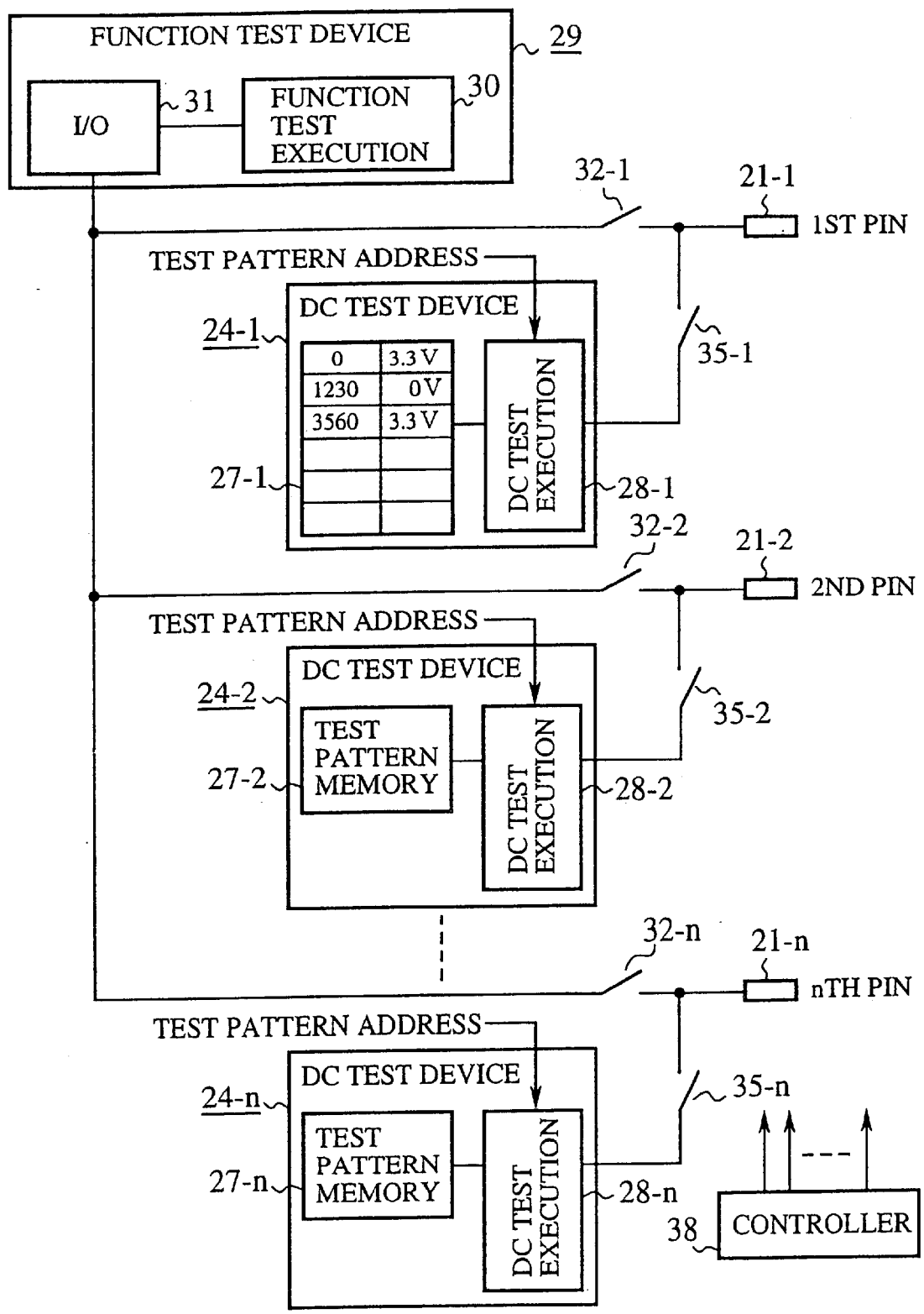
FIG. 1 shows a construction of a LSI tester according to a first embodiment of the present invention.

FIG. 1 shows a construction of a LSI tester according to the first embodiment. Referring to FIG. 1, the LSI tester comprises tester pins 21-1 through 21-n connected to respective input/output pins of a semiconductor integrated circuit, and dc test devices 24-1 through 24-n for testing the semiconductor integrated circuit to determine its dc characteristic by applying a program-controlled voltage or current to the tester pins 21-1 through 21-n, respectively.

The dc test devices 24-1 through 24-n comprise test pattern memories 27-1 through 27-n, respectively, for storing voltage values corresponding test pattern addresses, and also comprise dc test execution units 28-1 through 28-n, respectively, for applying, in a dc test, a predetermined voltage or current to the tester pins 21-1 through 21-n, respectively. The dc test execution units 28-1 through 28-n apply, when any of the dc test devices 24-1 through 24-n is connected to the corresponding ones of the tester pins 21-1 through 21-n for a function test, a voltage for the function test to the corresponding ones of the tester pins 21-1 through 21-n by referring to the corresponding ones of the test pattern memories 27-1 through 27-n, respectively.

The LSI tester further comprises a function test device 29 for testing the semiconductor integrated circuit to determine its function by applying, to the tester pins 21-1 through 21-n, the voltage corresponding to the test pattern for a function test, and receiving, via the tester pins 21-1 through 21-n, logic values returned from the semiconductor integrated circuit as a result of the application of the test pattern voltage.

The function test device 29 includes a function test execution unit 30 for generating the test patterns for a function test and determining the function of the semiconductor integrated circuit, and an input/output unit 31 for applying the voltage generated by the function test execution unit 30 to the tester pins 21-1 through 21-n, receiving, via the tester pins 21-1 through 21-n, logic values returned from the semiconductor integrated circuit as a result of the application of the test pattern voltage, and supplying the returned logic values to the function text execution unit 30. The LSI tester further includes switches 32-1 through 32-n for connecting the function test device 29 to the tester pins 211 through 21-n when a function test is performed, switches 35-1 through 35-n for connecting the dc test devices 24-1 through 24-n to the test pins 21-1 through 21-n, respectively, when a dc test is performed, and a controller 38 for controlling the dc test devices 24-26, the function test device 29, the switches 32-1 through 32-n and the switches 35-1 through 35-n.

Figure 2:
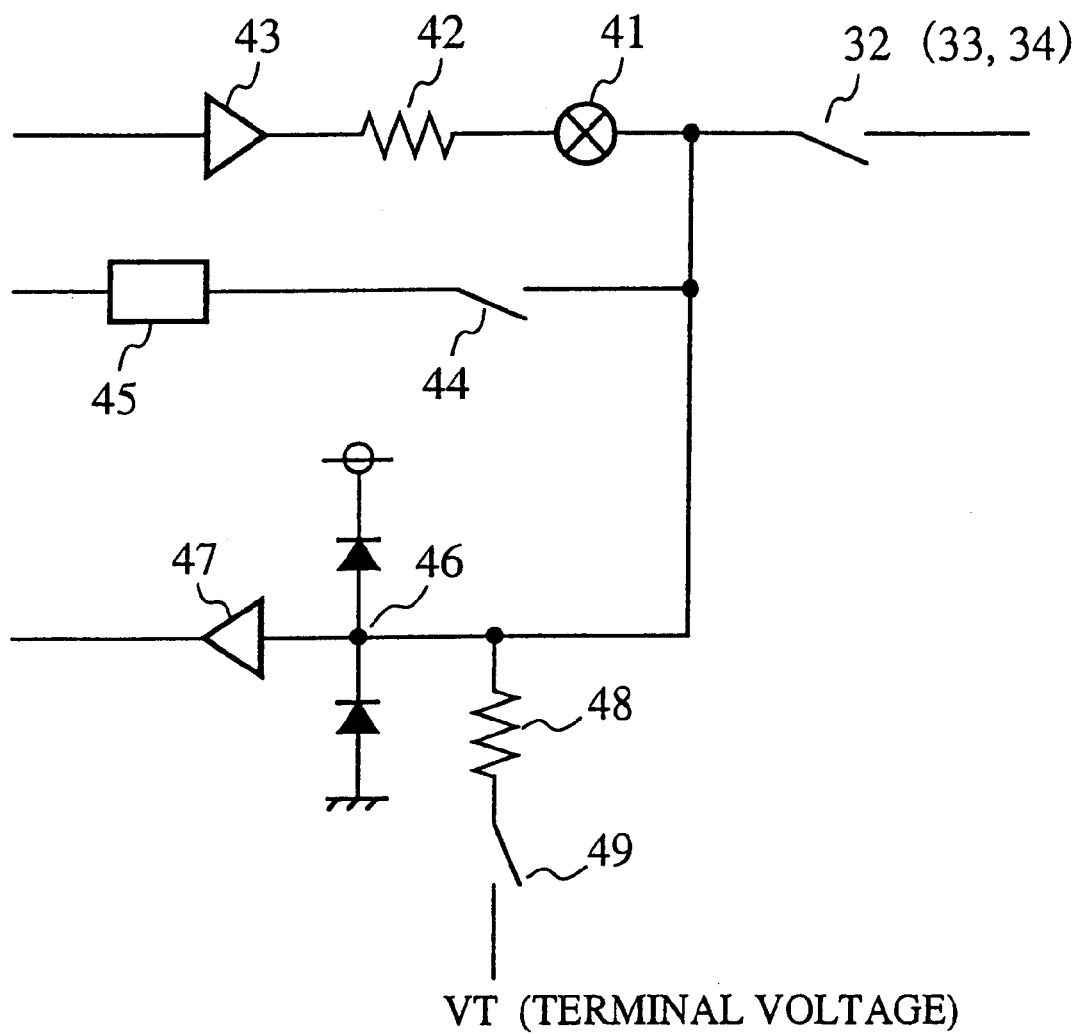
FIG. 2 shows a construction of an input/output unit of a function test device.

FIG. 2 shows a construction of the input/output unit 31. Referring to FIG. 2, the input/output unit 31 includes a switch 41, a resistor 42, a driver 43 for applying a voltage corresponding to a test pattern to a tester pin, a switch 44, a dynamic load 45 for providing a predetermined current load to an input/output pin of a semiconductor integrated circuit 45 when a logic value resultant from the application of the test pattern voltage is output from the input/output pin, a diode clamp 46 for suppressing an overshoot and an undershoot of the voltage output from the input/output pin of the semiconductor integrated circuit, a comparator 47 for determining the level of the voltage output from the input/output pin of the semiconductor integrated circuit, a terminal resistor for placing an input/output pin of the semiconductor integrated circuit at a predetermined voltage when a logic value resultant from the application of the test pattern voltage is output from the input/output pin, and a switch 49.

Figure 3:
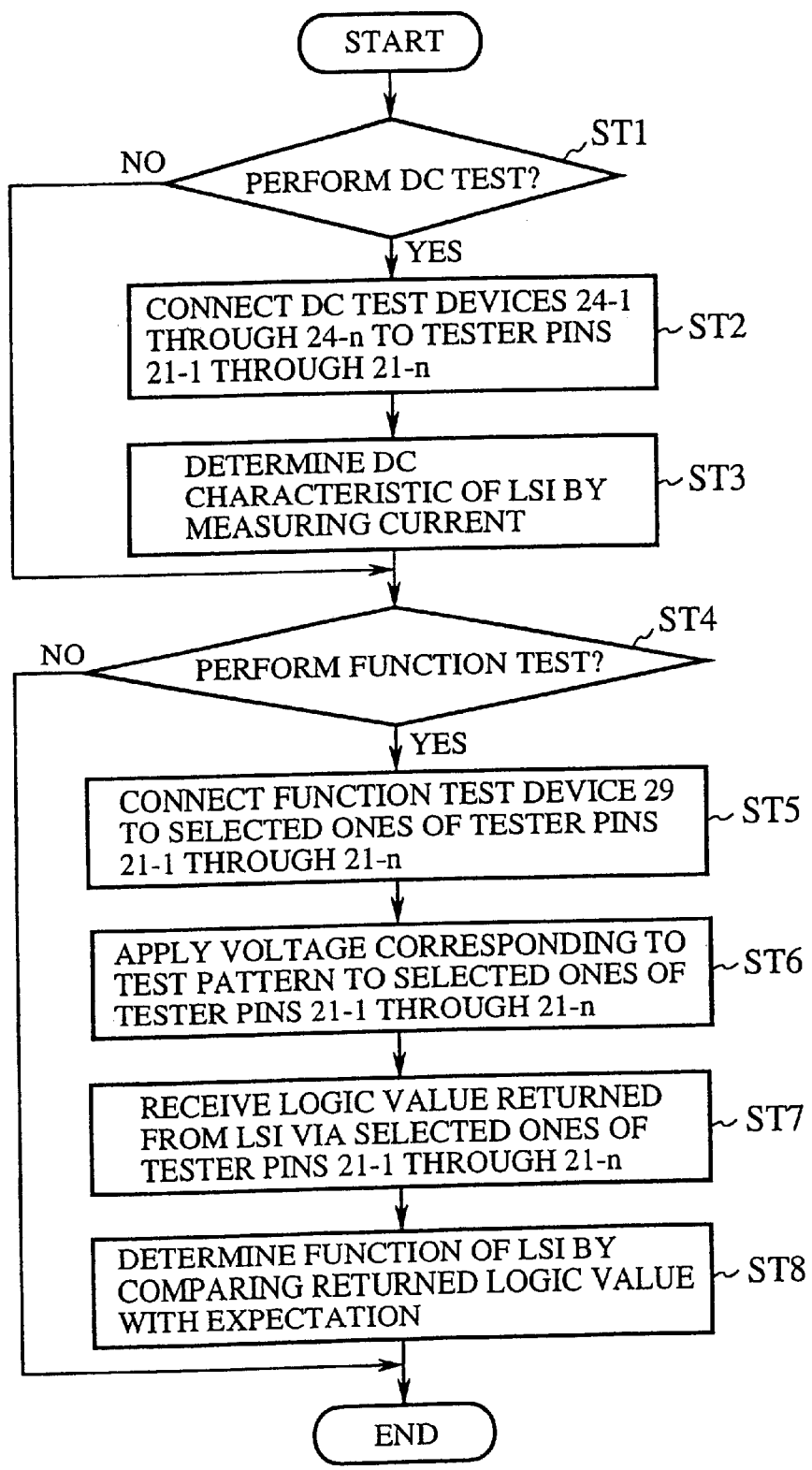
FIG. 3 is a flowchart showing a LSI test method according to the first embodiment.

FIG. 3 is a flowchart showing a LSI test method according to the first embodiment.

A description will now be given of a LSI test according to the first embodiment.

When a dc test is performed, the controller 38 turns the switches 32-1 through 32-n off and the switches 35-1 through 35-n on so as to connect the dc test devices 24-1 through 24-n to the tester pins 21-1 through 21-n, respectively (step ST1, ST2).

Under the control of the controller 38, the dc test devices 24-1 through 24-n apply a program-controlled voltage to the tester pins 21-1 through 21-n to test the semiconductor integrated circuit for its dc characteristic.

Figure 4:
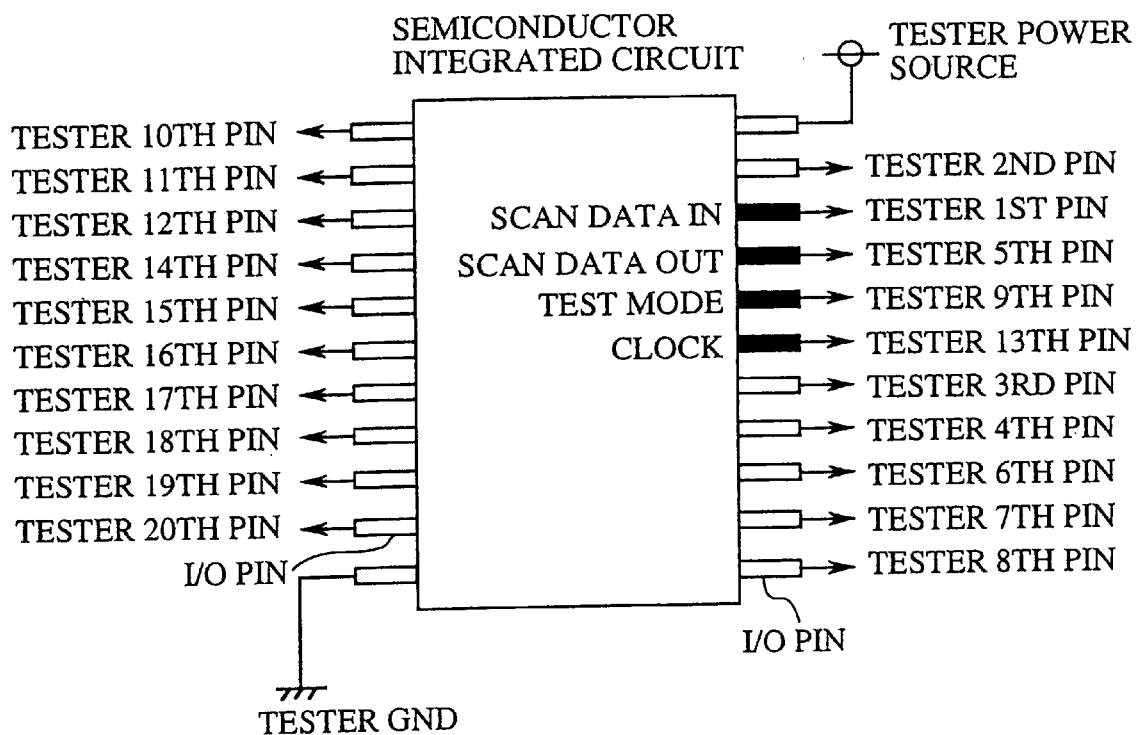
FIG. 4 is an illustration showing how a test of a semiconductor integrated circuit is performed.

For example, first through twentieth tester pins of the LSI tester are connected to the respective input/output pins of the semiconductor integrated circuit, as shown in FIG. 4.

A predetermined voltage for example, 3.3 V) may be applied to the test pins 21-1 through 21-n. A measurement is made to determine if a current is output from the input/output pin of the semiconductor integrated circuit. If a current is not output, each of the dc test execution units 28-1–28-n determines that the circuit is normal (step ST3).

In this example, the predetermined voltage is applied to the tester pins 21-1 through 21-n. The dc characteristic of the semiconductor integrated circuit may also be determined by supplying a program-controlled current to the tester pins 21-1 through 21-n and measuring the voltage applied to the input/output pins of the semiconductor integrated circuit.

Each of the dc test execution units 28-1 through 28-n may be composed of a constant current source and a volt meter for IFVM and a constant voltage source and an ammeter for VFIM.

When a function test is performed, the controller 38 normally turns selected ones of the switches 32-1 through 32-n on and also turns the switches 35-1 through 35-n off so as to connect the function test device 29 to selected ones of the tester pins 21-1 through 21-n (step ST4, ST5).

Subsequently, under the control of the controller 38, the function test execution unit 30 generates a test pattern for a function test.

The function test execution unit 30 may comprise a timing generator for generating timing signals for defining a test period, a rise time and a fall time of an input waveform of a voltage applied to a tester pin, an input/output switch time and a time required for determination. The function test execution unit 30 may also include a pattern memory for storing test patterns, and a formatter for generating the input waveform based on the test pattern and the timing signals and generating expectation values subject to comparison with the logic value returned from the semiconductor integrated circuit.

The input/output unit 31 applies the voltage corresponding to the test pattern to the selected ones of the tester pins 21-1 through 21-n (step ST6).

It is not necessary to apply the voltage to the tester pins connected to the input/output pins not subject to the function test. These tester pins are not connected to the function test device 29. It is to be noted that some of the input/output pins not subject to the function test may have to be maintained at a high voltage level or a low voltage level. Other input/output pins not subject to the function test may have to be placed at a variable voltage level while a function test is being performed.

Accordingly, the dc test device should be connected to the tester pins connected to the above-described input/output pins that require special attention so that these input/output pins are placed at a desired voltage level.

A description will now be given of how the input/output pins requiring special attention are placed at a desired voltage level while a function test is being performed.

The controller 38 provides a pattern address 38 to selected ones of the dc test devices 24-1 through 24-n. The dc test execution unit of the dc test device receiving the pattern address refers to the test pattern memory so as to determine a voltage applied to the associated tester pin and apply that voltage to the associated tester pin. For example, if the test pattern address received from the controller 38 is "3560", a voltage of 3.3 V may be applied to the associated tester pin.

In the example of FIG. 4, it is assumed that the first pin, the fifth pin, the ninth pin and the thirteenth pin of the LSI tester pins are connected to input/output pins involved in the function test. The tester pins other than these are not connected to the function test device 29. Some of the tester pins not connected to the function test device 29 may be connected to the dc test device as required.

By applying a voltage corresponding to a test pattern to selected ones of the tester pins 21-1 through 21-n, that is, to selected ones of the input/output pins of a semiconductor integrated circuit, the semiconductor integrated circuit executes logic operations responsive to the test pattern and output corresponding results to the associated input/output pins. The input/output unit 31 receives the results via the selected ones of the tester pins 21-1 through 21-n so as to supply the received results to the function test execution unit 30 (step ST7).

Upon receipt of the results from the semiconductor integrated circuit, the function test execution unit 30 compares the results with the expectation values corresponding to the test pattern to determine whether the semiconductor integrated circuit is operating properly (step ST8).

Thus, when a dc test is performed according to the first embodiment, the dc test devices 24-1 through 24-n are connected to the tester pins 21-1 through 21-n, respectively. In a function test, the function test device 29 is connected to selected ones of the tester pins 21-1 through 21-n. Thus, a function test can be performed by providing only one function test device, which is relatively expensive. Consequently, the production cost of a LSI tester is reduced and the cost for testing a semiconductor integrated circuit is reduced.

Different semiconductor integrated circuits have different number of input/output pins. By controlling the switches 32-1 through 32-n and the switches 35-1 through 35-n, connection between the function test device 29 and selected ones of the tester pins 21-1 through 21-n can be controlled in a desired manner. Accordingly, a LSI tester with enhanced general-purpose capability can be produced.

Embodiment 2

Figure 5:
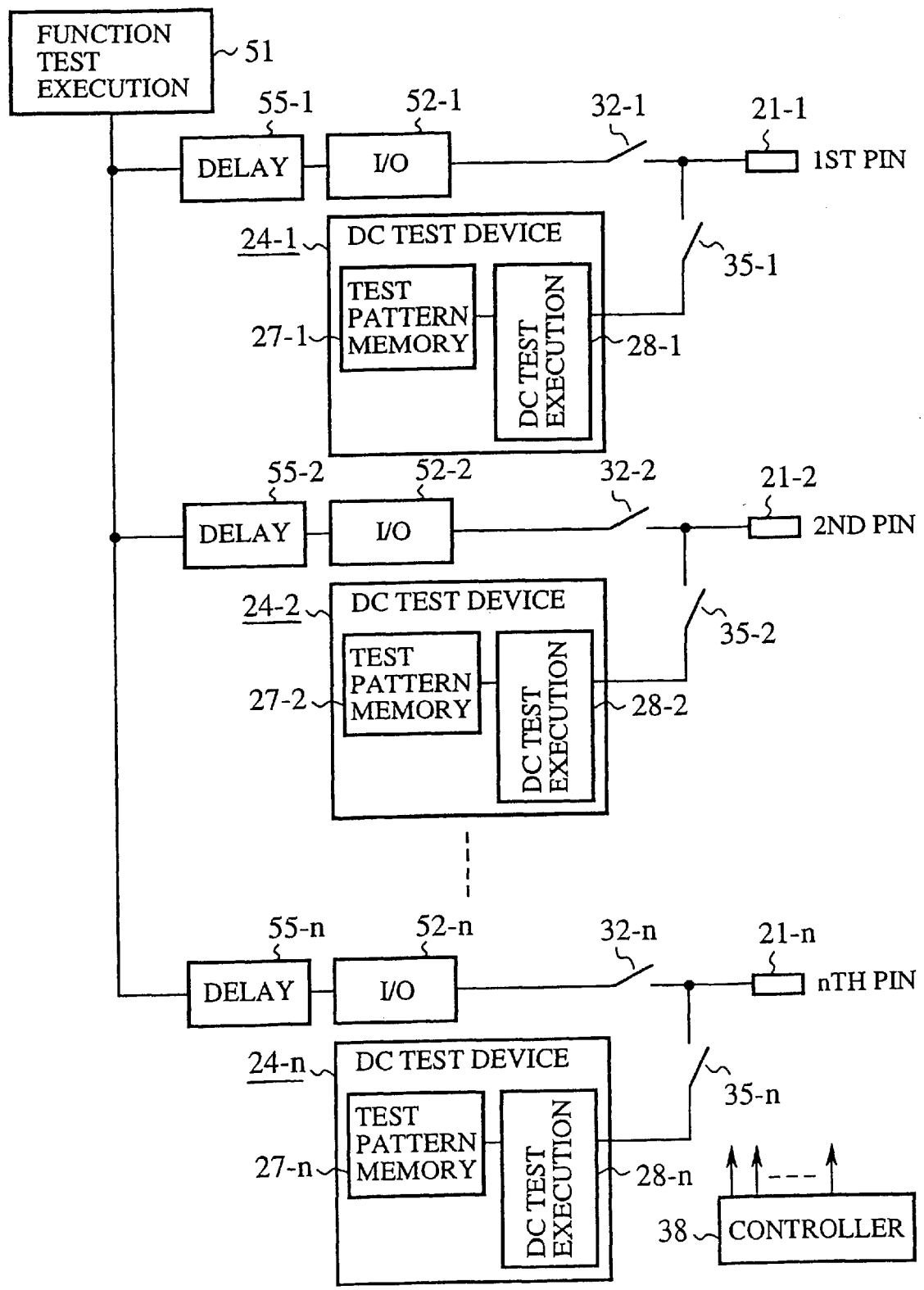
FIG. 5 shows a construction of a LSI tester according to a second embodiment of the present invention.
Figure 6:
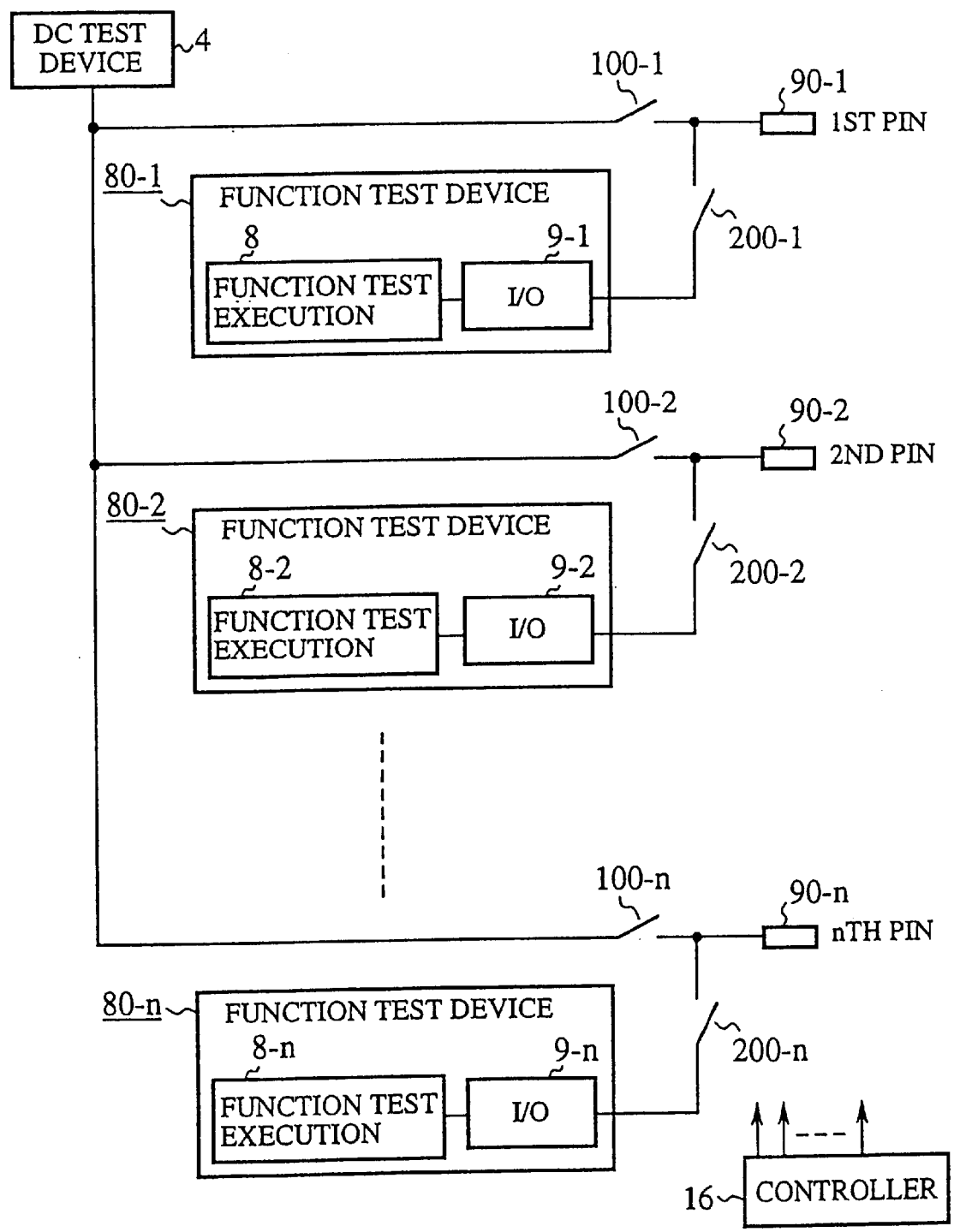
FIG. 6 shows a construction of a LSI tester according to the related art.

FIG. 5 shows a LSI tester according to the second embodiment. In FIG. 5, those parts corresponding to the parts of FIG. 1 are identified with the same numerals and the description thereof is omitted.

The LSI tester includes a function test execution unit 51 for generating a test pattern for a function test and determining the function of a semiconductor integrated circuit, input/output units 52-1 through 52-n for applying the voltage corresponding to the test pattern generated by the function test execution unit 51 to the tester pins 21-1 through 21-n, respectively, and supplying, to the function test execution unit 51, the logic values returned from the semiconductor integrated circuit as a result of the application of the voltage and received via the tester pins 21-1 through 21-n, respectively. The LSI tester further includes delay circuits 55-1 through 55-n for canceling differences in signal transmission time due to differences in transmission channel length, that is, differences in distance between the input/output unit 52-1 through 52-n and the function test execution unit 51.

A description will now be given of the operation of the LSI tester according to the second embodiment.

In the first embodiment, only one function test device 29 comprising the function test execution unit 30 and the input/output unit 31 is provided. If there are variations in distance between the function test device 29 and the tester pins 21-1 through 21-n, an output signal (the voltage corresponding to the test pattern) from the function test device 29 arrives at the tester pins 21-1 through 21-n with varying degrees of delay.

Consequently, by using different sets of tester pins, the timing of the voltage applied to corresponding input/output pins of the semiconductor integrated circuit varies, making it difficult to perform an accurate function test.

In the second embodiment, in order to cancel variations in signal transmission time owing to differences in transmission channel length, the input/output units 52-1 through 52-n are provided for respective tester pins. Moreover, the delay circuits 55-1 through 55-n are provided to precede the input/output units 52-1 through 52-4, respectively.

For example, if the signal transmission time is 1.0 ns between the function test execution unit 51 and the input/output unit 52-1, 1.5 ns between the function test execution unit 51 and the input/output unit 52-2, 2.0 ns between the function test execution unit 51 and the input/output unit 52-n, variations in signal transmission time due to the differences in signal transmission channel length are canceled by configuring the tester such that the delay circuit 55-1 provides a delay of 1.0 ns, the delay circuit 55-2 provides a delay of 0.5 ns and the delay circuit 55-3 provides a delay of 0.0 ns.

With this construction, any desired set of tester pins may be used such that individual tests via respective tester pins occur simultaneously.

The second embodiment differs from the first embodiment in that the input/output units 52-1 through 52-n, instead of the input/output unit 31, are provided close to the tester pins 21-1 through 21-n, respectively. Therefore, time required for output signals (the voltage corresponding to the test pattern) from the input/output units 52-1 through 52-n to reach the respective input/output pins of the semiconductor integrated circuit is reduced.

Thus, time elapsing between the output of a test pattern voltage from each of the input/output units 51-1 through 51-n and the receipt of the result of logic operation in the semiconductor integrated circuit is reduced.

If the receipt of the result of logic operation in the semiconductor integrated circuit in response to the output of a voltage corresponding to a test pattern is preceded by the output of a voltage corresponding to a next test pattern, a collision between the output signal and the input signal occurs. For this reason, the voltage corresponding to the next pattern has to wait until the logic operation result for the preceding test pattern is input.

In this respect, the feature provided by the second embodiment, i.e. reduction in time required for a logic operation result to be received responsive to the output of a test pattern voltage, improves the speed of a function test.

The present invention is not limited to the above-described embodiments and variations and modifications may be made without departing from the scope of the present invention.

What is claimed is:

1. A LSI tester comprising:
   a plurality of tester pins each connected to an input/output pin of a semiconductor integrated circuit;
   a plurality of dc test devices each applying one of a predetermined voltage and a predetermined current to a corresponding one of said plurality of tester pins so as to determine a dc characteristic of the semiconductor integrated circuit;
   a function test device for determining a function of the semiconductor integrated circuit by applying a voltage corresponding to a function test pattern to selected ones of said plurality of tester pins and receiving, via the selected ones of said plurality of tester pins, corresponding logic values returned from the semiconductor integrated circuit as a result of the application of the voltage; and
   connecting means for connecting, in the dc test, said plurality of dc test devices to said plurality of tester pins, respectively, and connecting, in the function test, said function test device to the selected ones of said plurality of tester pins.

2. The LSI tester according to claim 1, wherein each of said plurality of dc test devices is provided with a memory for storing voltages corresponding to test pattern addresses, and determines, in response to a receipt of a test pattern address, one of the predetermined voltage and the predetermined current applied to the corresponding one of said plurality of tester pins by referring to the memory.

3. The LSI tester according to claim 2, wherein said connecting means connects, in the function test, those of said plurality of tester pins connected to the input/output pins not involved in the function test, to corresponding ones of said plurality of dc test devices.

4. A LSI tester comprising:
   a plurality of tester pins each connected to an input/output pin of a semiconductor integrated circuit;
   a plurality of dc test devices each applying one of a predetermined voltage and a predetermined current to a corresponding one of said plurality of tester pins so as to determine a dc characteristic of the semiconductor integrated circuit;
   function test execution means for generating a voltage corresponding to a function test pattern and determining a function of the semiconductor integrated circuit;
   a plurality of input/output means each applying a voltage corresponding to the test pattern generated by said function test execution means to a corresponding one of said plurality of tester pins, and supplying, to said function test executing means, a corresponding logic value returned from the semiconductor integrated circuit as a result of the application of the voltage and received via the corresponding one of said plurality of tester pins; and
   connecting means for connecting, in the dc test, said plurality of dc test devices to said plurality of tester pins, respectively, and connecting, in the function test, selected ones of said plurality of input/output means to corresponding ones of said plurality of tester pins.

5. The LSI tester according to claim 4, wherein a delay circuit is provided between each of said plurality of input/output means and the function test execution means.

6. A method of testing a LSI comprising the steps of:
   applying one of a predetermined voltage and a predetermined current to a plurality of tester pins connected to input/output pins of a semiconductor integrated circuit, in a dc test for determining a dc characteristic of the semiconductor integrated circuit; and
   applying a voltage corresponding to a function test pattern to selected ones of said plurality of tester pins, and receiving, via the selected ones of the plurality of tester pins, logic results returned from the semiconductor integrated circuit as a result of the application of the voltage, in a function test for determining the function of the semiconductor integrated circuit; wherein
   the method further comprises:
      connecting, in the dc test, a plurality of dc test devices for determining the dc characteristic to the plurality of tester pins, respectively; and
      connecting, in the function test, a function test execution unit for determining the function to selected ones of the plurality of tester pins.

* * * * *